(12) United States Patent
Varnica et al.

(10) Patent No.: US 8,799,737 B1
(45) Date of Patent: Aug. 5, 2014

(54) SOFT-INFORMATION MODIFICATION IN CONCATENATED DECODING SYSTEMS

(75) Inventors: Nedeljko Varnica, San Jose, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 174 days.

(21) Appl. No.: 13/370,354

(22) Filed: Feb. 10, 2012

Related U.S. Application Data

(60) Provisional application No. 61/443,193, filed on Feb. 15, 2011.

(51) Int. Cl.
*H03M 13/00* (2006.01)
(52) U.S. Cl.
USPC ........... 714/755; 714/780; 714/786; 714/794; 375/341

(58) Field of Classification Search
USPC .......... 714/747, 755, 780, 794, 786; 375/295, 375/316, 341
See application file for complete search history.

(56) References Cited

U.S. PATENT DOCUMENTS

| 6,629,287 B1* | 9/2003 | Brink ............................ 714/755 |
| 2003/0066020 A1* | 4/2003 | Morita et al. ................. 714/794 |
| 2012/0063533 A1* | 3/2012 | Fonseka et al. ............... 375/295 |

* cited by examiner

*Primary Examiner* — Guy Lamarre (57) ABSTRACT

Systems, methods, and other embodiments associated with data decoding are described. According to one embodiment, a method includes receiving an output value from one of a first block and a second block that form a pair of concatenated decoding blocks. The method includes determining a value of a modification criteria and modifying the output value based, at least in part, on the value of the modification criteria to form a modified output value. The modified output value is input to one of the first and second decoding blocks.

21 Claims, 5 Drawing Sheets

SOFT-INFORMATION MODIFICATION IN CONCATENATED DECODING SYSTEMS

CROSS REFERENCE TO RELATED APPLICATIONS

This patent disclosure claims the benefit of U.S. Provisional Application No. 61/443,193 filed on Feb. 15, 2011, which is hereby wholly incorporated by reference in its entirety.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Many data storage systems (e.g., disk drives) employ some type of coding system in which data being stored is combined, or encoded, with redundant information to form a codeword that meets a priori established constraints. Codewords that are received or retrieved from memories (e.g., read from a hard disk drive sector) are checked against the constraints to determine if the codeword has been correctly read. If the codeword does not meet the constraints, several techniques may be used to attempt to correct the codeword. One of the popular techniques is to use codes that are amenable to iterative decoding approaches, and correct the codeword via iterative decoding techniques.

Figure 1:
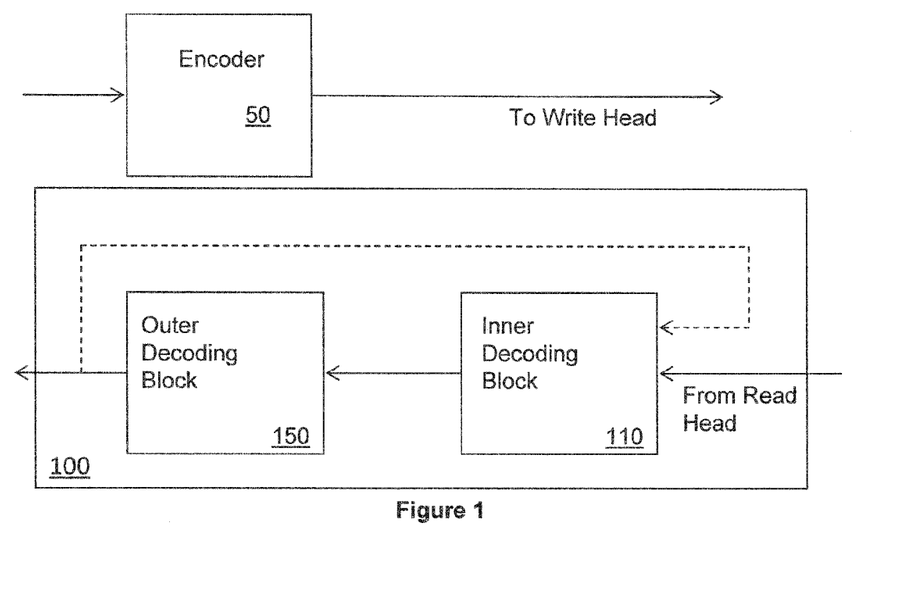
FIG. 1 illustrates one example of a concatenated decoding system.

FIG. 1 illustrates an example of a coding system that includes an encoder 50 and a decoding system 100. The coding system encodes user data with the encoder 50 to form one or more codewords. The codewords are sent to a write head that writes the codeword to physical memory. The decoding system 100 is a concatenated decoder that includes an inner decoding block 110 and an outer decoding block 150. The concatenated decoding system 100 receives a digital signal from a read head and processes the signal to output decoded user data.

Both decoding blocks 110, 150 may calculate "soft information" about the values of the bits in a codeword. The soft information communicates a likely value of a bit as well as a confidence or likelihood that the value is correct. One example of soft information is a Log-Likelihood Ratio (LLR). The LLR for a given bit is the log of the quotient of the probability that the bit is zero divided by the probability the bit is one. If the LLR is negative, the bit is more likely a one and if the LLR is positive, the bit is more likely a zero.

The soft information from the inner decoding block 110 is fed to the outer decoding block 150. The outer decoding block 150 processes the soft information from the inner decoding block 110 to attempt to decode the codeword. The soft information from the outer decoding block 150 is typically fed back to the inner decoding block 110 and the decoding process continues until the LLRs reach a threshold level of confidence or until a predetermined number of iterations has been performed.

Coding systems with intrinsic channel memory may include an inner decoding block 110 that is a channel detector or equalizer and an outer decoding block 150 that is a soft decoder that uses an error correcting code (ECC) such as a Low Density Parity Check (LDPC) code. Examples of systems with intrinsic channel memory are data storage systems (e.g., hard drives). These systems model the channel between read/write heads acting on the data. Another example of systems with intrinsic channel memory are wireless channels used in modeling the physical channel between transmitter and receiver in the communications over wireless links.

SUMMARY

In one embodiment an apparatus includes first and second decoding blocks. The apparatus also includes a logic configured to determine a value of a modification criteria, and based on the value of the modification criteria, modify a selected output value corresponding to one of an output of the first decoding block and an output of the second decoding block. The modification is made prior to the selected output being input to either of the second and first decoding blocks. In one embodiment, the logic is configured to access a lookup table associated with the value of the modification criteria. The lookup table maps output values to revised output values. The logic is configured to modify the selected output value to a revised output value based on the lookup table. In one embodiment, the logic is configured to select a scaling factor associated with the value of the modification criteria, and to apply the scaling factor to the selected output value.

In another embodiment, a method includes receiving an output value from one of a first block and a second block that form a pair of concatenated decoding blocks. The method includes determining a value of a modification criteria and modifying the output value based, at least in part, on the value of the modification criteria to form a modified output value. The modified output value is input to one of the first and second decoding blocks. In one embodiment, the method includes receiving a soft information output value from a channel detector or decoder. In one embodiment, the method includes accessing a lookup table associated with the value of the modification criteria that maps output values to revised output values, and modifying the output value to a revised output value based on the lookup table. In one embodiment the method includes selecting a scaling factor associated with the value of the modification criteria, and applying the scaling factor to the output value. In one embodiment, the method includes comparing the output value to a threshold value and when the output value is greater than the threshold value changing the output value to the threshold value.

In another embodiment, a device includes a memory device configured to store data encoded as codeword bits and a decoder in communication with the memory device. The decoder includes an inner decoding block and an outer decoding block. The inner decoding block is configured to read a codeword bits from the memory device and to output inner soft information that specifies probable values for codeword bits. The outer decoding block is configured to input the soft information from the inner decoding block and to output outer soft information that specifies probable values for codeword bits. The device also includes a logic configured to determine a value of a modification criteria, and modify a selected output value corresponding to one of the inner soft information and outer soft information based on the value of the modification criteria. The modification is made prior to the selected output value being input to either of the inner and outer decoding blocks.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are systems, methods, and other embodiments associated with modifying soft information in concatenated decoding systems. In typical concatenated decoding systems, such as the system 100 of FIG. 1, soft information from one decoding block is fed directly to the other decoding block. The systems, methods, and other embodiments described herein modify the soft information prior to feeding the soft information to a decoding block. This allows systems to compensate for properties of particular decoding system components or channels that tend to skew soft information.

For example, it has been observed in some decoding systems that alternating patterns of bit values (e.g., 10101 . . . ) in codewords often causes difficulties in decoding. Using the systems and methods described herein, if an alternating bit pattern is detected, the probabilities communicated by the soft information may be modified to reflect a lower probability prior to the soft information being used by a subsequent decoding block. In other decoding systems, it may be advantageous to modify soft information based on a state of one or both of the decoding blocks. For example, soft information may be modified to reflect a higher confidence in later iterations while in earlier iterations, the soft information is modified to reflect a lower confidence.

Figure 2:
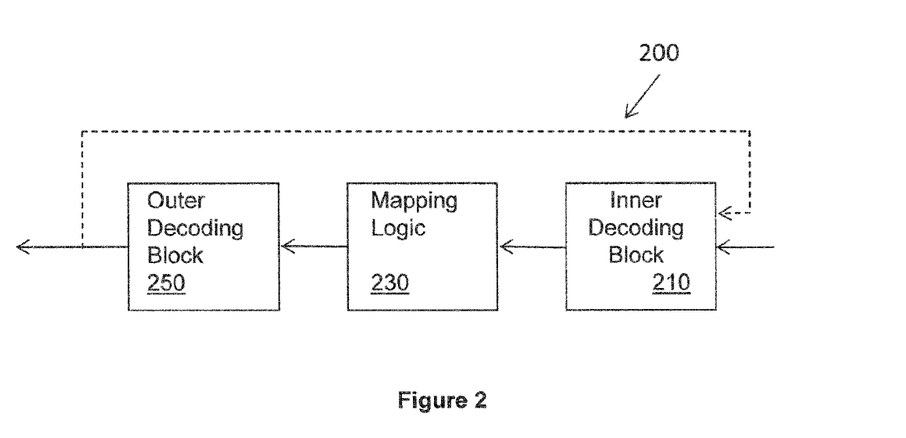
FIG. 2 illustrates one embodiment of an apparatus associated with modifying soft information in concatenated decoding systems.

With reference to FIG. 2, one embodiment of an apparatus 200 is shown that is associated with modifying soft information in a concatenated decoding system. The apparatus 200 includes an inner decoding block 210 that receives a digital signal corresponding to a codeword bits read from memory and transmitted by way of a channel to the inner decoding block 210. In one embodiment, the inner decoding block is a Soft Output Viterbi Algorithm (SOVA) channel detector that equalizes the input digital signal and outputs soft information about the likely values of the codeword bits. The output (e.g., soft information) from the inner decoding block 210 is input to a mapping logic 230.

The mapping logic 230 is configured to modify the output of the inner decoding block based on some modification criteria. As suggested above, the modification criteria may be a particular bit pattern and/or a decoder state. As will be described in more detail with reference to FIGS. 5, 6, and 7, the mapping logic 230 may access a mapping table associated with the present value of the modification criteria. The mapping table maps a current output value to a revised output value. The mapping logic 230 modifies the output of the inner decoding block 210 to reflect the revised output value. Alternatively, the mapping logic 230 may apply a scaling factor or some fixed incremental increase or decrease to the current output value.

The modified output value is input to an outer decoding block 250, which uses the modified output value to perform decoding operations. In some embodiments, the outer decoding block 250 is an LDPC soft decoder. The output (e.g., soft information) of the outer decoding block 250 may be fed back to the inner decoding block 210. The mapping logic 230 may modify the output of the inner decoding block 210 in each iteration, or select iterations, until decoding operations are complete.

Figure 3:
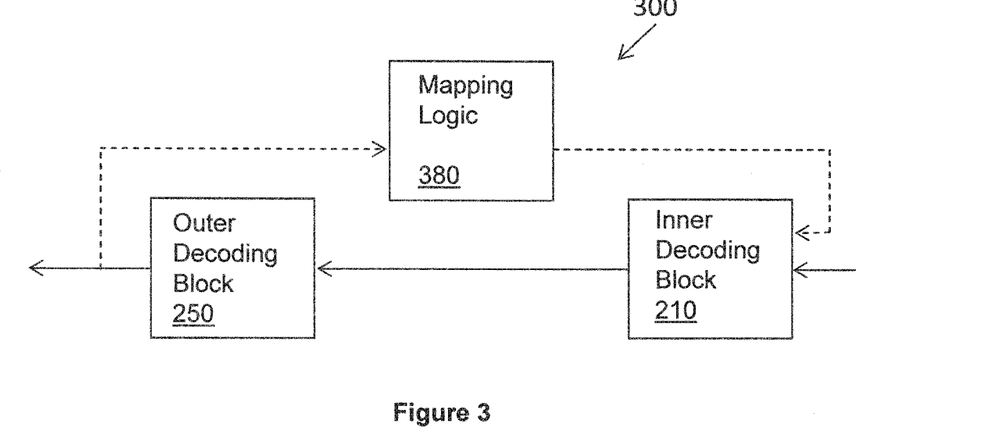
FIG. 3 illustrates one embodiment of an apparatus associated with modifying soft information in concatenated decoding systems.

With reference to FIG. 3, one embodiment of an apparatus 300 is shown that is associated with modifying soft information in a concatenated decoding system. Like apparatus 200 of FIG. 2, the apparatus 300 includes the inner decoding block 210 and the outer decoding block 250. In some embodiments, the inner decoding block is a SOVA channel detector and/or the outer decoding block is an LDPC soft decoder. In the apparatus 300, the output (e.g., soft information) from the outer decoding block 250 is input to a mapping logic 380.

The mapping logic 380 is configured to modify the output of the outer decoding block based on some modification criteria. As suggested above, the modification criteria may be a particular bit pattern and/or a decoder state. As will be described in more detail with reference to FIGS. 5, 6, and 7, the mapping logic 380 may access a mapping table associated with the present value of the modification criteria. The mapping table maps a current output value to a revised output value. The mapping logic 380 modifies the output of the outer decoding block 250 to reflect the revised output value. Alternatively, the mapping logic 380 may apply a scaling factor or some fixed incremental increase or decrease to the current output value.

The modified output value is input to the inner decoding block 210, which uses the modified output value to perform decoding operations. The mapping logic 380 will modify the output of the outer decoding block 250 in each iteration, or in select iterations, until decoding operations are complete.

Figure 4:
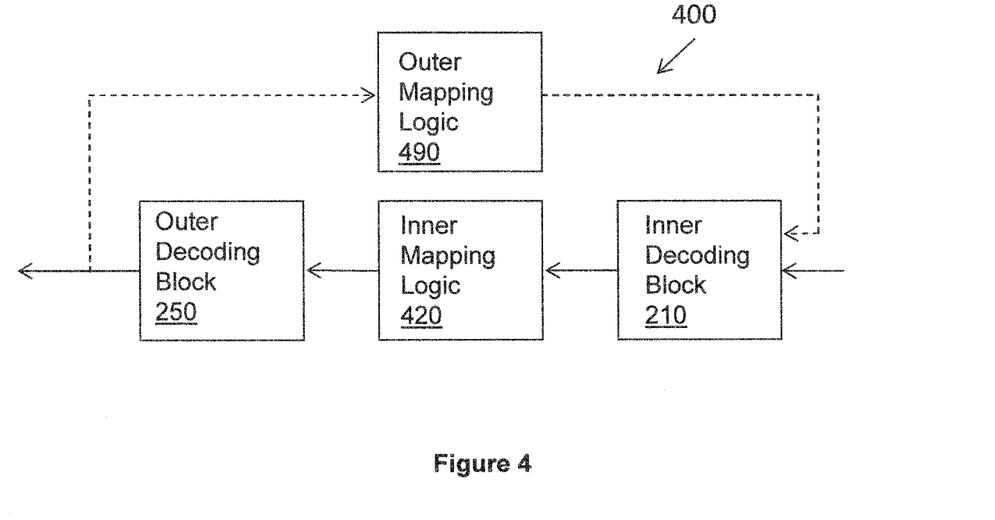
FIG. 4 illustrates one embodiment of an apparatus associated with modifying soft information in concatenated decoding systems.

With reference to FIG. 4, one embodiment of an apparatus 400 is shown that is associated with modifying soft information in a concatenated decoding system. Like apparatus 200, 300 in FIGS. 2 and 3, the apparatus 400 includes the inner decoding block 210 and the outer decoding block 250. In some embodiments, the inner decoding block is a SOVA channel detector and/or the outer decoding block is an LDPC soft decoder. In the apparatus 400, the output (e.g., soft information) from the inner decoding block 210 is input to an inner mapping logic 420 and the output (e.g., soft information) from the outer decoding block 250 is input to an outer mapping logic 490.

The inner mapping logic 420 is configured to modify the output of the inner decoding block based on some modification criteria. As suggested above, the modification criteria may be a particular bit pattern and/or a decoder state. As will be described in more detail with reference to FIGS. 5, 6, and 7, the inner mapping logic 420 may access a mapping table associated with the present value of the modification criteria. The mapping table maps a current output value to a revised output value. The inner mapping logic 420 modifies the output of the inner decoding block 210 to reflect the revised output value. Alternatively, the inner mapping logic 420 may apply a scaling factor or some fixed incremental increase or decrease to the current output value.

The modified inner decoding block output value is input to the outer decoding block 250, which uses the modified inner decoding block output value to calculate soft information about likely codeword bit values. The outer mapping logic 490 is configured to modify the output of the outer decoding block 250 based on some modification criteria. As suggested above, the modification criteria may be a particular bit pattern and/or a decoder state. As will be described in more detail with reference to FIGS. 5, 6, and 7, the outer mapping logic 490 may access a mapping table associated with the present value of the modification criteria. The mapping table maps a current output value to a revised output value. The outer mapping logic 490 modifies the output of the outer decoding block 250 to reflect the revised output value. Alternatively, the outer mapping logic 490 may apply a scaling factor or some fixed incremental increase or decrease to the current output value.

The modified outer decoding block output value is input to the inner decoding block 210, which uses the modified outer decoding block output value to perform decoding operations. The mapping logics 420, 490, will modify the outputs of the inner decoding block 210 and the outer decoding block 250, respectively, in each iteration, or in select iterations, until decoding operations are complete.

Figure 5:
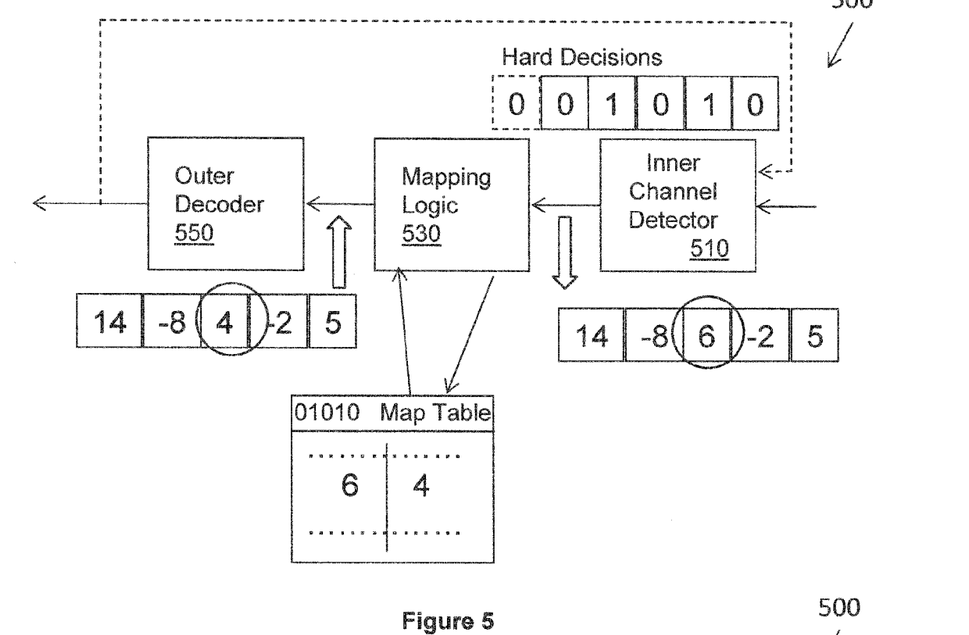
FIG. 5 illustrates one embodiment of an apparatus associated with modifying soft information in concatenated decoding systems.
Figure 6:
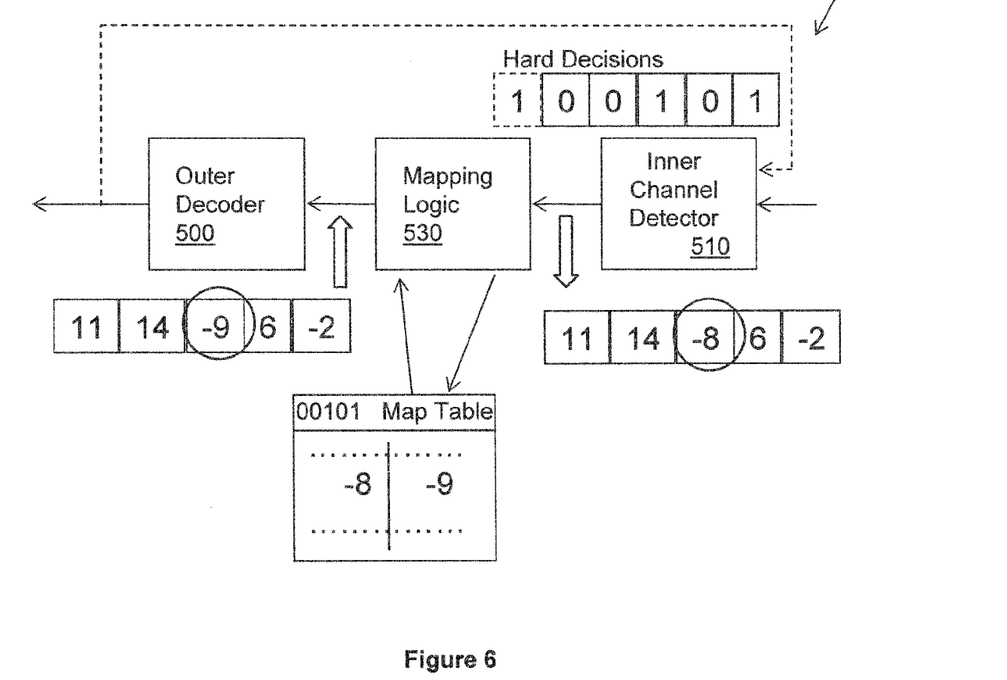
FIG. 6 illustrates one embodiment of an apparatus associated with modifying soft information in concatenated decoding systems.

FIGS. 5 and 6 illustrate operation of one embodiment of a concatenated decoding system 500 that modifies soft information. The decoding system 500 includes an inner channel detector 510, a mapping logic 530, and an outer decoder 550. Codeword bits are processed by the mapping logic 530 in groups of five. In other embodiments, the mapping logic 530 may process groups having a different number of bits. In FIG. 5, the inner channel detector 510 outputs soft information $\{14, -8, 6, -2, 5\}$, which are LLR values for each codeword bit. The greater the magnitude of the soft information for a bit, the higher the confidence in the bit's value. The soft information corresponds to a hard decision of 01010 (based on the sign of the LLR values). Another 0 bit value, which is shown in phantom, is the next codeword bit that will move into the group being processed in a subsequent time interval shown in FIG. 6. The mapping logic 530 uses the pattern of the hard decision bits (01010) as modification criteria to modify the soft decision values.

The mapping logic 530 modifies the third soft information value in the group of five as the codeword bits move through the decoding system. In other embodiments, other soft information values (e.g., second value out of group of five, several values, every $x^{th}$ bit, and so on) may be selected to be modified by the mapping logic 530. The mapping logic 530 accesses a map table that corresponds to the pattern of hard decision bits 01010 (e.g., the modification criteria value). The mapping logic 530 locates a revised output value "4" that corresponds to the current value "6" in the map table and revises the output of the inner channel detector 510 to reflect the revised output value.

In this manner, the soft information being input to the outer decoder 550 communicates a lower probability than the soft information output by the inner channel detector 510. This change in probability value may be made based on an assumption that alternating bit values result in coding difficulties. In other words, this change may be made based on an assumption that there exists a higher chance of over confidence in the provided soft information (LLRs) when underlying patterns are alternating patterns, such as 01010 or 10101. Conversely, there may exist a higher chance of under-confidence in provided soft information (LLRs), on other types of patterns. For instance, repeating patterns like 00000 or 11111 may be subject to under-confidence in soft information. Thus, the soft information being input to the outer decoder 550 for repeating patterns should communicate a higher probability than the soft information output by the inner channel decoder 510.

Generally such mapping may vary from system to system and could be determined during testing and/or monitoring of the system. The mapping should compensate for a mismatch between the existing detector and a truly optimal detector. This compensation is helpful when the truly optimal detector is unavailable, unaffordable, too complex for practical implementation, or when the system is subject to excessive noise or interference.

Another example where mapping as described above may be used is during a retry mode that is provided by the system. In these systems, the retry mode allows for more time and resources to be made available for codewords that failed to decode correctly during regular decoding attempts. In retry mode, for certain blocks or sectors of data (e.g., certain codewords) one mapping may work better, while for other blocks of data another mapping may be more beneficial. One reason for this could be that the noise/interference may vary from one block of data to another.

FIG. 6 illustrates the decoding system 500 in operation on the next codeword bit. The mapping logic 530 accesses a map table that corresponds to the pattern of hard decision bits 00101 (e.g., the modification criteria value). The mapping logic 530 locates a revised output value "−9" that corresponds to the current value "−8" in the map table and revises the output of the inner channel detector 510 to reflect the revised output value. In this manner, the soft information being input to the outer decoder 350 communicates a higher probability than the soft information output by the inner channel detector 510.

Figure 7:
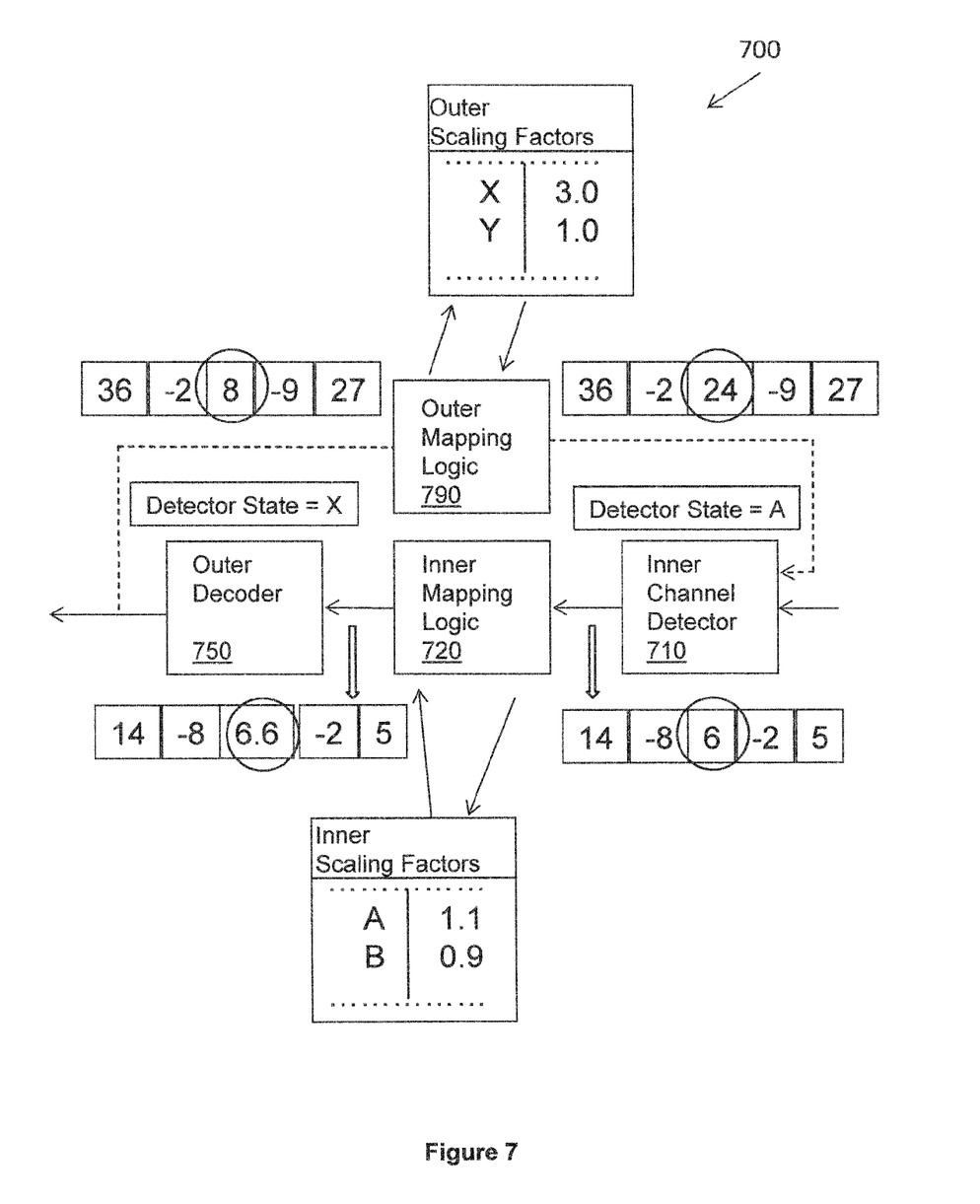
FIG. 7 illustrates one embodiment of an apparatus associated with modifying soft information in concatenated decoding systems.

FIG. 7 illustrates one embodiment of a decoding system 700 that modifies soft information. The decoding system 700 includes an inner channel detector 710, an inner mapping logic 720, an outer decoder 550, and an outer mapping logic 790. Codeword bits are processed by the inner mapping logic 720 in groups of five. In other embodiments, groups may include more or less bits. In FIG. 7, the inner channel detector 710 outputs soft information $\{14, -8, 6, -2, 5\}$. The inner channel detector 710 has a current state of "A". For example, state A may correspond to a fourth decoding iteration on the same group of codeword bits. Thus, the scaling factor applied to the soft information may be varied depending on the number of iterations that have occurred.

The state "A" may also correspond to a certain underlying pattern and a certain iteration. The state "A" may correspond to a state in a SOVA detector or a state in an LDPC decoder. As described above, the state "A" may be the decoded state (hard decoded values) on a set of bit locations (after SOVA detection or LDPC detection). The state "A" may be the total decoded confidence on a set of bits (after SOVA detection or LDPC detection), and so on. In different embodiments, the state "A" may be a combination of states described above. The inner mapping logic 720 uses the state of the inner channel detector 710 as a modification criteria to modify the soft decision values.

The inner mapping logic 720 modifies the third soft information value in the group of five as the codeword bits move through the decoding system. The inner mapping logic 720 determines an inner scaling factor that corresponds to the state of the inner channel detector 710 (e.g., the modification criteria value). The inner mapping logic 720 determines the scaling factor "1.1" that corresponds to state "A" and revises the output of the inner channel detector 710 to reflect the scaled output value. In this manner, the soft information being input to the outer decoder 750 communicates a higher probability than the soft information output by the inner channel detector 710.

The outer decoder 750 processes the modified output of the inner channel detector and outputs soft information {36, –2, 8, –9, 27}. The outer decoder 750 has a current state of "X". For example, state X may correspond to a fourth decoding iteration on the same group of codeword bits. Thus, the scaling factor applied to the soft information may be varied depending on the number of iterations that have occurred. Other states, described above, could be used to determine the appropriate table to be used in the mapping. Such states include LDPC decoder states, SOVA decoder states, number of iterations, or a combination of states. The outer mapping logic 790 uses the state of the outer decoder 750 as a modification criteria to modify the soft decision values output by the outer decoder 750.

The outer mapping logic 790 modifies the third soft information value in the group of five as the codeword bits move through the decoding system. The outer mapping logic 790 determines an outer scaling factor that corresponds to the state of the outer decoder 750 (e.g., the modification criteria value). The outer mapping logic 790 determines the scaling factor "3.0" that corresponds to state "X" and revises the output of the outer decoder 750 to reflect the scaled output value. In this manner, the soft information being input to the inner channel detector 710 communicates a higher probability than the soft information output by the outer decoder 750.

Instead of scaling, a clipping/saturation technique may be used. For example, the clipping/saturation technique may be performed as follows: an LLR magnitude (or multiple select LLR magnitudes) may be compared to a threshold $T_{LLR}$, then the system may set the LLR output value to $T_{LLR}$, where the original sign of the LLR is kept. In another embodiment, scaling can be combined with the clipping/saturation approach.

Figure 8:
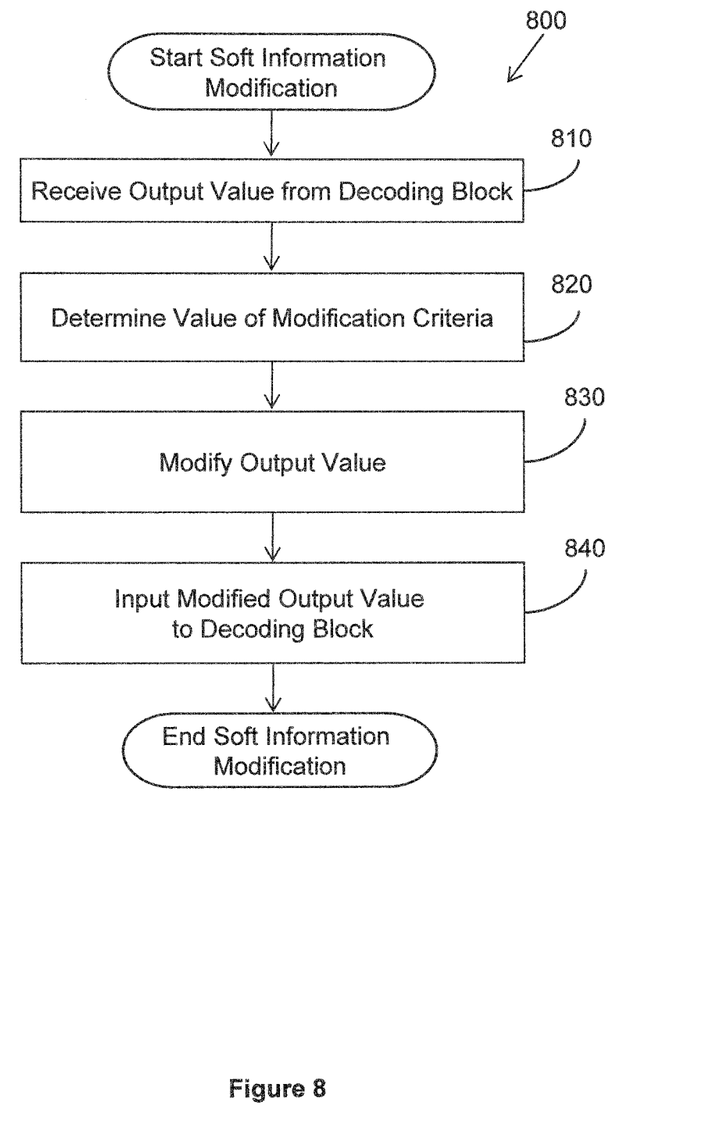
FIG. 8 illustrates one embodiment of a method associated with modifying soft information in concatenated decoding systems.

FIG. 8 illustrates one embodiment of a method 800 that modifies soft information. The method includes, at 810, receiving an output value from one of an inner and outer decoding block that form a pair of concatenated decoding blocks. At 820, a value of a modification criteria is determined. At 830, the output value is modified, based, at least in part, on the value of the modification criteria. At 840, the method includes inputting the modified output value to one of the outer and inner decoding blocks.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While examples of systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
a first decoding block configured to input a first input signal and output a first output signal;
a second decoding block configured to input a second input signal and output a second output signal; and
a logic configured to:
receive a first output signal value;
determine a value of a modification criterion;
access a table that maps modification criterion values to modification operations;
selecting a modification operation mapped to the modification criterion value; and
perform the selected modification operation on the first output signal value to create a second input signal value for the second input signal that is input to the second decoding block.

2. The apparatus of claim 1, wherein the first decoding comprises a channel detector and the second decoding block comprises a decoder.

3. The apparatus of claim 1, wherein the first decoding block comprises a decoder and the second decoding block comprises a channel detector.

4. The apparatus of claim 1, wherein the logic is configured to determine the value of the modification criterion by identifying a pattern exhibited by hard decision values over two or more iterations.

5. The apparatus of claim 1, wherein the logic is configured to determine the value of the modification criterion by identifying an operating state of one or more of the first decoding block and the second decoding block.

6. The apparatus of claim 1, wherein the table maps modification criterion values to a replacement value for first output values, and further wherein the logic is configured to modify the first output value to a replacement value to mapped to the first output value to create the second input value.

7. The apparatus of claim 1, wherein the table maps modification criterion values to scaling factors and further wherein the logic is configured to apply a scaling factor that is mapped to the modification criterion value to the first output value to create the second input value.

8. The apparatus of claim 1 wherein the first output value and the second input value correspond to soft information.

9. The apparatus of claim 1 wherein the first decoding block and the second decoding block are inner and outer decoding blocks, respectively, that are concatenated.

10. A method, comprising:
 receiving a first output value from a first decoding block;
 determining a value of a modification criterion;
 accessing a table that maps modification criterion values to modification operations;
 selecting a modification operation mapped to the modification criterion value; and
 performing the selected modification operation on the first output value to create a second input value; and
 inputting the second input value to a second decoding block.

11. The method of claim 10, wherein receiving the first output value comprises receiving a soft information value output from a channel detector or decoder.

12. The method of claim 10, wherein determining the value of the modification criterion comprises comparing the first output value to a threshold value and wherein performing the selected modification operation comprises changing the first output value to the threshold value to create the second input value.

13. The method of claim 10, wherein determining the value of the modification criterion comprises identifying a pattern exhibited by hard decision values over two or more iterations.

14. The method of claim 10, wherein determining the value of the modification criterion comprises identifying an operating state of one or more of the first decoding block and the second decoding block.

15. The method of claim 10, wherein the table maps modification criterion values to replacement output values, and wherein performing the modification operation comprises modifying the first output value to a replacement output value mapped to the modification criterion value to create the second input value.

16. The method of claim 10, wherein the table maps modification criterion values to scaling factors and wherein performing the modification operation comprises applying a selected scaling factor to the first output value to create the second input value.

17. A device comprising:
 a memory device configured to store data encoded as codeword bits; and
 a decoder in communication with the memory device, wherein the decoder comprises:
  an inner decoding block configured to read a codeword bits from the memory device and to output inner soft information that specifies probable values for codeword bits;
  an outer decoding block configured to input a second input signal that is based on the soft information from the inner decoding block and to output outer soft information that specifies probable values for codeword bits, wherein the outer soft information is combined with the codeword bits and input to the inner decoding block to as a first input signal; and
 a logic configured to:
  determine a value of a modification criterion;
  access a table that maps modification criterion values to modification operations;
  select a modification operation mapped to the modification criterion value;
  perform the selected modification operation on the inner soft information to create the second input signal; or
  perform the selected modification operation on the outer soft information to create the first input signal.

18. The device of claim 17, wherein the logic is configured to determine a value of the modification criterion by identifying a pattern in hard decisions corresponding to the inner soft information.

19. The device of claim 17, wherein the logic is configured to determine the value of the modification criterion by identifying an operating state of one or more of the inner decoding block and the outer decoding block.

20. The device of claim 17 wherein the selected modification operation comprises applying a selected scaling factor to the inner soft information or outer soft information.

21. The device of claim 17, wherein the selected modification operation comprises a replacement of the inner soft information or outer soft information with a selected replacement value.

* * * * *